United States Patent
Anderson

(10) Patent No.: US 6,304,439 B1
(45) Date of Patent: Oct. 16, 2001

(54) DISK DRIVE SLED INSERTION AND REMOVAL SYSTEM

(75) Inventor: Lester C. Anderson, San Jose, CA (US)

(73) Assignee: Connex, Total Technologies, Inc., Lake Forest, CA (US)

( * ) Notice: Subject to any disclaimer, the term of this patent is extended or adjusted under 35 U.S.C. 154(b) by 0 days.

(21) Appl. No.: 09/385,809

(22) Filed: Aug. 30, 1999

(51) Int. Cl.[7] ........................................ G06F 1/16
(52) U.S. Cl. .................. 361/685; 361/679; 361/683; 361/684; 361/686
(58) Field of Search ............... 361/679, 683–686

(56) References Cited

U.S. PATENT DOCUMENTS

| | | |
|---|---|---|
| Re. 35,915 | 10/1998 | Hastings et al. . |
| 5,010,426 * | 4/1991 | Krenz ................. 360/97.01 |
| 5,077,722 | 12/1991 | Geist et al. . |
| 5,379,084 | 1/1995 | Barraza et al. . |
| 5,557,499 | 9/1996 | Reiter et al. . |
| 5,654,873 | 8/1997 | Smithson et al. . |
| 5,668,696 | 9/1997 | Schmitt . |
| 5,765,933 | 6/1998 | Paul et al. . |
| 6,058,016 * | 5/2000 | Anderson et al. ................ 361/727 |

\* cited by examiner

*Primary Examiner*—Leo P. Picard
*Assistant Examiner*—Yean-Hsi Chang
(74) *Attorney, Agent, or Firm*—Milad G Shara; Won Tae C Kim

(57) ABSTRACT

A removable storage system includes a disk drive sled assembly for supporting a disk drive and for insertion and removal of the disk drive from a mating bay assembly. The bay assembly includes a pivotable cam assembly that includes a pair of cam legs configured to pivot about a cam rotation axis when a cam grip member is rotated. The sled assembly includes a conductive support frame. The disk drive is disposed in the conductive support frame and is attached to respective inner surfaces of the sled floor wall and the sled ceiling wall. A pair of rails is fastened to respective outer surfaces of the sled floor wall and the sled ceiling wall for supporting the sled assembly in corresponding channels disposed in the bay assembly. A is bezel attached to the sled end wall and includes a handle member for manually gripping the sled assembly. A trough having a first and a second surface is formed in the bezel. The trough is disposed to engage the legs such that upon partial insertion of the sled assembly into the bay assembly when the grip member is rotated away from the opening, the legs engage the first surface to urge the disk drive sled into the bay assembly and such that upon partial removal of the sled assembly from the bay assembly when the grip member is rotated toward the opening, the legs engage the second surface to urge the disk drive out of the bay assembly.

7 Claims, 2 Drawing Sheets

DISK DRIVE SLED INSERTION AND REMOVAL SYSTEM

BACKGROUND OF THE INVENTION

1. Field of the Invention

The present invention relates to removable storage systems. More particularly, the present invention relates to removable storage systems in which a bay assembly mates with a disk drive sled assembly that supports a disk drive and that allows insertion and removal thereof from the bay assembly.

2. Description of the Prior Art and Related Information

Disk arrays allow high data storage capacities at relatively low cost. Such arrays (configured as a Redundant Array of Independent Disks (RAID), for example) typically include many interconnected magnetic disk drives. To allow the array to be expanded or to allow easy replacement of inoperative drives requires that drives be added or swapped, often without powering down the array. Such removable disk drives, whether disposed in a RAID enclosure or within a server, are often disposed within a drive rack assembly. The drive rack assembly typically includes a bay assembly that receives a disk drive housed in a removable and mating disk "sled" assembly. To populate the bay assembly with disk drives, the disk drive sled assembly is inserted within the bay assembly until the disk drive interface signal connector mates with and is fully seated within a corresponding connector disposed at the rear of the bay assembly.

However, conventional removable storage system disk sled assemblies are susceptible to damage from mishandling and are relatively costly to manufacture and to assemble. An improved disk sled assembly, therefore, would include fewer moving parts, be relatively robust and less susceptible to mishandling and should be inexpensive to manufacture and to assemble. Moreover, to avoid damaging the respective connectors of the disk drive and the bay assembly during insertion and removal of the sled assembly from the bay assembly, the disk drive sled assembly should be precisely guided within the bay assembly and some perceptible indicia should indicate when the disk drive connector is fully mated with and seated within the corresponding connector at the rear of the bay assembly. Additionally, such an improved sled assembly should be simple to use and suited to single-hand operation.

SUMMARY OF THE INVENTION

An object of the present invention, therefore, is an improved removable storage system that has few moving parts, is easy to use and is inexpensive to manufacture and to assemble. A further object of the present invention is to provide an improved bay assembly that precisely guides the disk drive sled assembly into the bay assembly and securely mates and fully seats the disk drive connector with the corresponding connector on the bay assembly.

Accordingly, the present invention may be regarded as a removable storage system that includes a bay assembly for receiving a disk drive, the disk drive including a disk drive connector and a disk drive sled assembly for supporting the disk drive and for insertion into the bay assembly and removal from the bay assembly. The bay assembly includes an opening bounded by a bay floor wall and a bay ceiling wall. The bay floor wall and the bay ceiling wall each have a channel formed for receiving a respective guide rail, a backplane for carrying disk drive interface signals, a backplane connector, the backplane connector being adapted to mate with the disk drive connector to connect the disk drive interface signals to the disk drive, a cam member for sliding the sled assembly in or out of the bay assembly, a cam support frame for supporting the cam member, a cam support surface for attaching the cam support frame to the bay assembly and a pin for pivotally supporting the cam member in the cam support frame. The cam member includes a first leg and a second leg for engaging the sled assembly, the legs being spaced-apart to form a guide path for guiding one of the guide rails into a respective channel, a bore for inserting the pin to establish a cam rotation axis and a grip member for pushing the cam member to rotate about the cam rotation axis. The cam support frame includes a cam support frame back wall, a pair of cam support frame side walls, a bore in each cam support frame side wall for inserting and supporting the pin and attachment means for attaching the cam support frame back wall to the cam support surface.

The disk drive sled assembly includes a conductive support frame having a sled side wall, a sled ceiling wall, a sled floor wall, a sled end wall and an opening opposite the sled end wall, the disk drive being disposed in the conductive support frame and attached to respective inner surfaces of the sled floor wall and the sled ceiling wall. A pair of rails is fastened to respective outer surfaces of the sled floor wall and the sled ceiling wall for supporting the disk drive sled assembly in the bay assembly channels. A bezel is attached to the sled end wall and includes a handle member for manually gripping the disk drive sled assembly and a trough formed in the bezel having a first surface and a second surface. The trough is disposed to engage the legs such that upon partial insertion of the sled assembly into the bay assembly when the grip member is rotated away from the backplane, the legs engage the first surface to urge the disk drive sled into the bay assembly to connect the connectors and such that upon partial removal of the sled assembly from the bay assembly when the grip member is rotated toward the backplane, the legs engage the second surface to urge the disk drive out of the bay assembly and to disconnect the connectors.

According to further embodiments of the present invention, the disk drive sled assembly may further comprise an array of grounding fingers conductively fastened to the sled end wall. The first surface of the trough may be closer to the opening than the second surface of the trough. One cam support frame side wall of the pair of cam support frame side walls may include a protrusion and the cam member may include an indentation that mates with the protrusion upon rotation of the cam member to form a detent.

The present invention may also be viewed as a disk drive sled assembly for supporting a disk drive and for insertion and removal from a mating bay assembly, the bay assembly comprising a pivotable cam assembly that includes a pair of cam legs configured to pivot about a cam rotation axis when a cam grip member is rotated. The sled assembly includes a conductive support frame having a sled side wall, a sled ceiling wall, a sled floor wall, a sled end wall and an opening opposite the sled end wall. The disk drive is disposed in the conductive support frame and attached to respective inner surfaces of the sled floor wall and the sled ceiling wall. A pair of rails is fastened to respective outer surfaces of the sled floor wall and the sled ceiling wall for supporting the disk drive sled assembly in corresponding channels disposed in the bay assembly. A bezel attached to the sled end wall includes a handle member for manually gripping the disk drive sled assembly and a trough formed in the bezel having a first surface and a second surface. The trough is disposed to engage the legs such that upon partial insertion of the sled assembly into the bay assembly when the grip member is rotated away from the opening, the legs engage the first surface to urge the disk drive sled into the bay assembly and such that upon partial removal of the sled assembly from the bay assembly when the grip member is rotated toward the opening, the legs engage the second surface to urge the disk drive out of the bay assembly.

The foregoing and other features of the invention are described in detail below and set forth in the appended claims.

DETAILED DESCRIPTION

Figure 1:
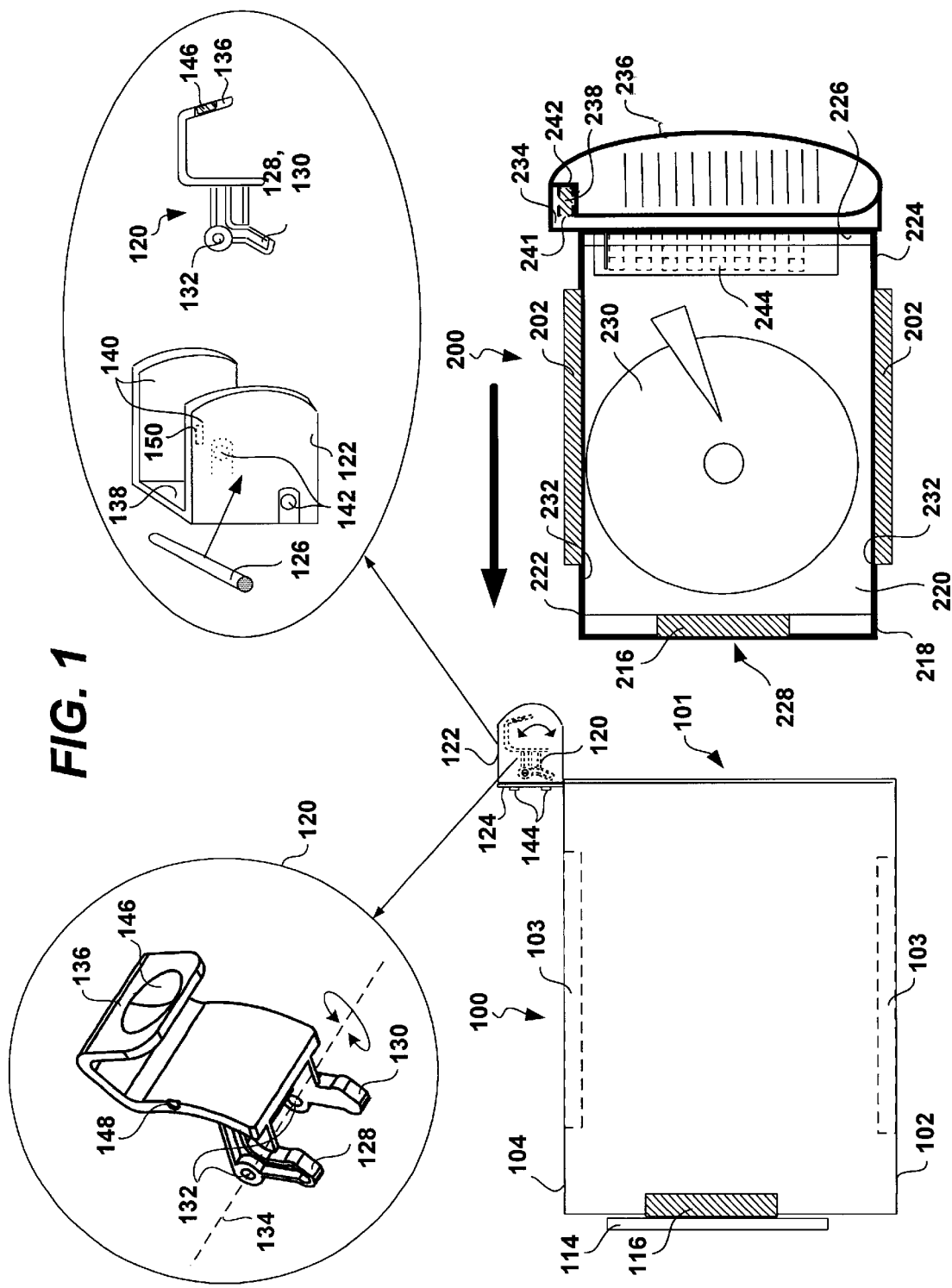
FIG. 1 is a composite diagram of the removable storage system according to an embodiment of the present invention.

FIG. 1 shows a partially exploded view of a removable storage system according to the present invention. The removable storage system shown in FIG. 1 has four main sub-assemblies, including a bay assembly 100 for receiving a disk drive 230, a disk drive sled assembly 200 for supporting the disk drive 230 and for insertion into the bay assembly 100 and for removal from the bay assembly 100, a cam member 120 for sliding the sled assembly 200 in or out of the bay assembly 100 and a cam support frame 122 for supporting the cam member 120.

The bay assembly 100 includes an opening 101 bounded by a bay floor wall 102 and a bay ceiling wall 104. The bay floor wall 102 and the bay ceiling wall 104 each have a channel 103 formed therein for receiving a respective guide rail 202. The bay assembly 100 also includes a backplane 114 for carrying disk drive interface signals and a backplane connector 116, the backplane connector 116 being adapted to mate with a disk drive connector 216 on the disk drive 230 to connect the disk drive interface signals to the disk drive 230.

The cam member 120, supported by the cam support frame 122, is operative to cause the sled assembly 200 to slide in or out of the bay assembly 100 through the opening 101. A cam support surface 124 on the bay assembly 100 allows the cam support frame 122 to be attached thereto, while a pin 126 pivotally supports the cam member 120 in the cam support frame 122. As shown in the left hand detail view of FIG. 1, the cam member 120 includes a first leg 128 and a second leg 130 for engaging the sled assembly 200, the legs 128, 130 being spaced-apart to form a guide path for guiding one of the guide rails 202 of the sled assembly 200 into a respective channel 103 of the bay assembly 100. A bore 132 allows the pin 126 to be inserted therethrough to establish a cam rotation axis, shown by the dashed line at reference numeral 134. The cam member 120 also includes a grip member 136 for pushing the cam member 120 to rotate about the cam rotation axis 134. The grip member 136 may include a concave cutout portion 146 to facilitate handling thereof. The cam support frame 122, as shown right hand detail view of FIG. 1, includes a cam support frame back wall 138, a pair of cam support frame side walls 140 and a bore 142 in each cam support frame side wall 140 for inserting and supporting the pin 126. When the cam member 120 is received in the cam support frame 122, the bore 142 of the cam support frame 122 is aligned with the bore 132 of the cam member 120. Attachment means 144 (such as screws, rivets or any other secure attachment means) are provided for attaching the cam support frame back wall 138 to the cam support surface 124 of the bay assembly 100.

Figure 2:
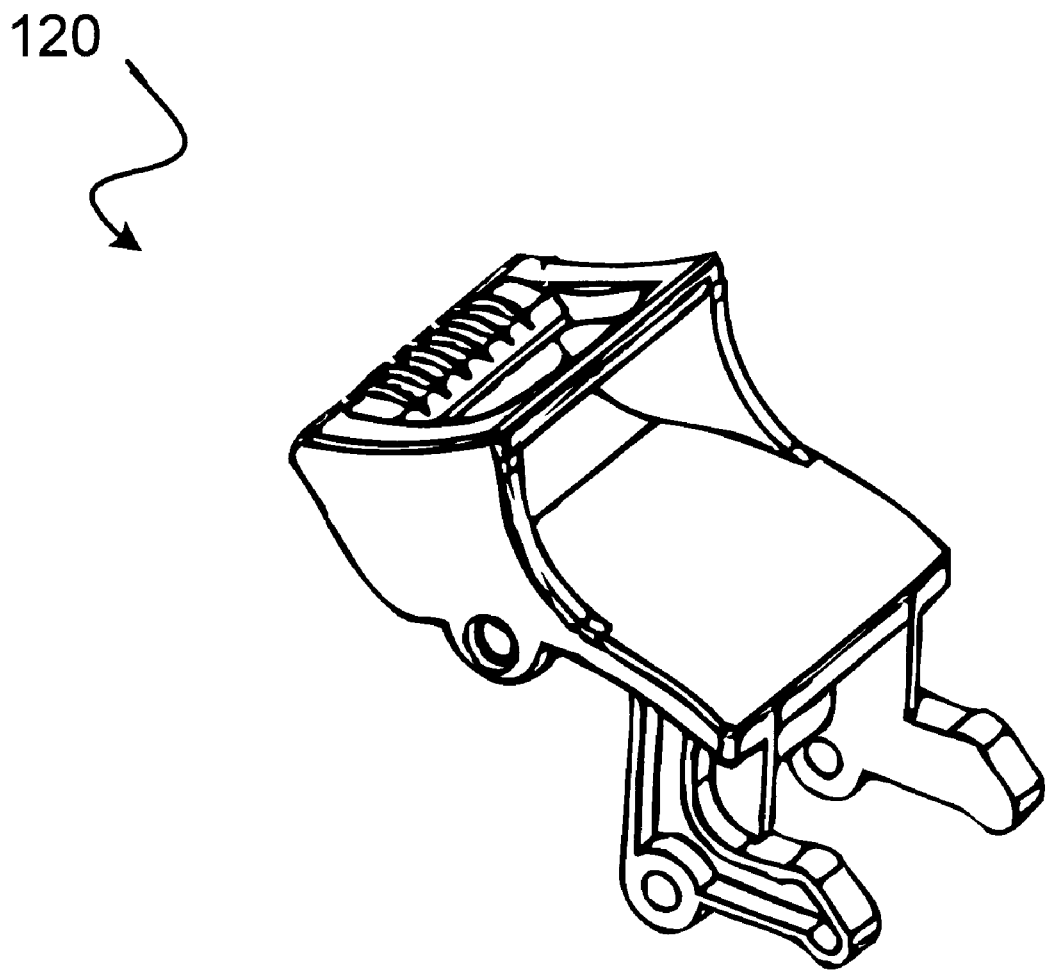
FIG. 2 is an alternate embodiment of the cam member 120 shown in FIG. 1.

FIG. 2 shows an alternate embodiment of cam member 120 having improved ergonomic features for engaging with a user's finger for rotating cam member 120 as discussed above.

Returning to FIG. 1, the disk drive sled assembly 200, according to the present invention, includes a conductive support frame 218 having a sled side wall 220, a sled ceiling wall 222, a sled floor wall 224, a sled end wall 226 and an opening 228 opposite the sled end wall 226. The disk drive connector 216 of the disk drive 230 is aligned with the opening 228 when the disk drive 230 is disposed in the conductive support frame 218 and is attached to the respective inner surfaces 232 of the sled floor wall 224 and the sled ceiling wall 222. A pair of rails 202 are fastened to respective outer surfaces of the sled floor wall 224 and the sled ceiling wall 222 to support the disk drive sled assembly 200 in the channels 103 of the bay assembly 100 when the sled assembly 200 is inserted within the bay assembly 100. A bezel 234 is attached to the sled end wall 226 and includes a handle member 236 for manually gripping the disk drive sled assembly 200. The bezel 234 further includes a trough 238 formed therein that includes a first surface 241 and a second surface 242. According to the present invention, the trough 238 is disposed to engage the legs such that upon partial insertion of the sled assembly 200 into the bay assembly 100 when the grip member 136 is rotated away from the backplane 114, the legs 128, 130 engage the first surface 241 to urge the disk drive sled 200 into the bay assembly 100 to connect the mating connectors 116, 216 and such that upon partial removal of the sled assembly 200 from the bay assembly 100 when the grip member 136 is rotated toward the backplane 114, the legs 128, 130 engage the second surface 242 of the trough 238 to urge the disk drive sled 200 out of the bay assembly 100 and to disconnect the connectors 116, 216. As shown in FIG. 1, the first surface 241 of the trough 238 is closer to the opening 228 than is the second surface 242 of the trough 238. As shown in the detail views of FIG. 1, one cam support frame side wall 140 of the pair of cam support frame side walls may include a protrusion 150 on the facing surface thereof The cam member 120 may include a corresponding indentation 148 that mates with the protrusion 150 upon rotation of the cam member 120 in the cam support frame 122 to form a perceptible detent. The detent provides a perceptible indicia to the person installing the disk drive sled 200 into the bay assembly that the disk drive sled 200 is fully inserted within the bay assembly 100. The detent also provides a perceptible (touch and/or audible) sensation that the backplane connector 116 of the bay assembly 100 is fully mated and seated with the disk drive connector 216, thereby ensuring good electrical contact therebetween. To provide protection against electromagnetic interference (EMI), the disk drive sled assembly 200 may further comprise an array of grounding fingers 244 conductively fastened to the sled end wall 226.

Suitably, the removable storage system according to the present invention includes few moving parts, is relatively robust and is inexpensive to manufacture and to assemble. Indeed, the sole moving part (other than the sled assembly 200) is the cam member 120 as it rotates about the pin 126. A disk installer wishing to remove an inoperative drive 230 within a sled assembly 200, for example, need only grasp the grip member 136 of the cam member 120 and rotate it toward the opening 228. This causes the legs 128, 130 to engage the second surface 242 of the trough 238 to urge the disk drive sled 200 out of the bay assembly 100 and to disconnect the connectors 116, 216. Thereafter, the installer has but to grasp the handle member 236 and pull the sled assembly 200 clear of the bay assembly 100. Similarly, to swap in a replacement drive, for example, the installer would grasp the handle member 236 of the sled assembly 200 containing the replacement drive 230 and insert the sled assembly 200 into the bay assembly 100. The legs 128, 130, being spaced-apart, form a guide path for guiding one of the guide rails 202 of the sled assembly 200 into a respective channel 103 of the bay assembly 100. When the second surface 242 of the trough 238 catches the legs 128, 130, the installer may then pull the grip member 136 away from the backplane 114, causing the legs 128, 130 to engage the first surface 241 to urge the disk drive sled 200 into the bay assembly 100 and to connect the connectors, 116, 216. When the protrusion 150 engages the corresponding indentation 148, the installer is provided with perceptible indicia that the sled assembly 200 is fully inserted with the bay assembly 100 and that the connectors 116, 216 are fully mated and seated. Alternatively, the protrusion 150/indentation 148 pair may be omitted. In that case, the installer may be assured that the connectors 116, 216 are fully mated and seated when the grip member 136 is fully rotated away from the backplane 114.

I claim:

1. A removable storage system comprising:
a bay assembly for receiving a disk drive, the disk drive including a disk drive connector;
a disk drive sled assembly for supporting the disk drive and for insertion into the bay assembly and removal from the bay assembly;
the bay assembly comprising:
an opening bounded by a bay floor wall and a bay ceiling wall; the bay floor wall and the bay ceiling wall each having a channel formed for receiving a respective guide rail;
a backplane for carrying disk drive interface signals;
a backplane connector, the backplane connector being adapted to mate with the disk drive connector to connect the disk drive interface signals to the disk drive;
a cam member for sliding the sled assembly in or out of the bay assembly;
a cam support frame for supporting the cam member;
a cam support surface for attaching the cam support frame to the bay assembly;
a pin for pivotally supporting the cam member in the cam support frame;
the cam member comprising:
a first leg and a second leg for engaging the sled assembly, the legs being spaced-apart to form a guide path for guiding one of the guide rails into a respective channel;
a bore for inserting the pin to establish a cam rotation axis;
a grip member for pushing the cam member to rotate about the cam rotation axis;
the cam support frame comprising:
a cam support frame back wall;
a pair of cam support frame side walls;
a bore in each cam support frame side wall for inserting and supporting the pin;
attachment means for attaching the cam support frame back wall to the cam support surface;
the disk drive sled assembly comprising:
a conductive support frame having a sled side wall, a sled ceiling wall, a sled floor wall, a sled end wall and an opening opposite the sled end wall, the disk drive being disposed in the conductive support frame and attached to respective inner surfaces of the sled floor wall and the sled ceiling wall;
a pair of rails fastened to respective outer surfaces of the sled floor wall and the sled ceiling wall for supporting the disk drive sled assembly in the bay assembly channels;
a bezel attached to the sled end wall comprising:
a grip member for manually gripping the disk drive sled assembly;
a trough formed in the bezel having a first surface and a second surface;
the trough being disposed to engage the legs such that upon partial insertion of the sled assembly into the bay assembly when the grip member is rotated away from the backplane, the legs engage the first surface to urge the disk drive sled into the bay assembly and to connect the connectors and such that upon partial removal of the sled assembly from the bay assembly when the grip member is rotated toward the backplane, the legs engage the second surface to urge the disk drive sled out of the bay assembly and to disconnect the connectors.

2. The removable storage system of claim 1, wherein the disk drive sled assembly further comprises an array of grounding fingers conductively fastened to the sled end wall.

3. The removable storage system of claim 1, wherein the first surface of the trough is closer to the opening than the second surface of the trough.

4. The removable storage system of claim 1, wherein one cam support frame side wall of the pair of cam support frame side walls comprises a protrusion and wherein the cam member comprises an indentation that mates with the protrusion upon rotation of the cam member to form a detent.

5. A disk drive sled assembly for supporting a disk drive and for insertion and removal from a mating bay assembly, the bay assembly comprising a pivotable cam assembly that includes a pair of cam legs configured to pivot about a cam rotation axis when a cam grip member is rotated, the sled assembly comprising:
a conductive support frame having a sled side wall, a sled ceiling wall, a sled floor wall, a sled end wall and an opening opposite the sled end wall, the disk drive being disposed in the conductive support frame and attached to respective inner surfaces of the sled floor wall and the sled ceiling wall;
a pair of rails fastened to respective outer surfaces of the sled floor wall and the sled ceiling wall for supporting the disk drive sled assembly in corresponding channels disposed in the bay assembly;
a bezel attached to the sled end wall comprising:
a handle member for manually gripping the disk drive sled assembly;
a trough formed in the bezel having a first surface and a second surface;
the trough being disposed to engage the legs such that upon partial insertion of the sled assembly into the bay assembly when the grip member is rotated away from the opening, the legs engage the first surface to urge the disk drive sled into the bay assembly and such that upon partial removal of the sled assembly from the bay assembly when the grip member is rotated toward the opening, the legs engage the second surface to urge the disk drive sled out of the bay assembly.

6. The disk drive sled assembly of claim 5, wherein the disk drive sled assembly further comprises an array of grounding fingers conductively fastened to the sled end wall.

7. The disk drive sled assembly of claim 5, wherein the first surface of the trough is closer to the opening than the second surface of the trough.

* * * * *